(12) United States Patent
Park et al.

(10) Patent No.: US 10,665,661 B2
(45) Date of Patent: May 26, 2020

(54) DISPLAY DEVICE WITH A TOUCH SENSOR AND HAVING IMPROVED RELIABILITY AND VISIBILITY

(71) Applicant: SAMSUNG DISPLAY CO., LTD., Yongin-si, Gyeonggi-do (KR)

(72) Inventors: Kwang Woo Park, Yongin-si (KR); Jeong Won Kim, Yongin-si (KR); Dong Ki Lee, Yongin-si (KR); Jin Ho Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/133,936

(22) Filed: Sep. 18, 2018

(65) Prior Publication Data

US 2019/0115411 A1 Apr. 18, 2019

(30) Foreign Application Priority Data

Oct. 16, 2017 (KR) .................. 10-2017-0134186

(51) Int. Cl.
*G06F 3/041* (2006.01)
*H01L 27/32* (2006.01)
*H01L 51/52* (2006.01)
*G06F 3/044* (2006.01)

(52) U.S. Cl.
CPC .......... *H01L 27/3272* (2013.01); *G06F 3/044* (2013.01); *G06F 3/0412* (2013.01); *G06F 3/0443* (2019.05); *G06F 3/0446* (2019.05); *H01L 27/323* (2013.01); *H01L 27/3248* (2013.01); *H01L 51/524* (2013.01); *H01L 51/5281* (2013.01); *H01L 51/5284* (2013.01); *G06F 3/0416* (2013.01); *G06F 2203/04111* (2013.01); *G06F 2203/04112* (2013.01); *H01L 27/3218* (2013.01); *H01L 51/5253* (2013.01)

(58) Field of Classification Search
CPC .................................................... G09G 3/3208
See application file for complete search history.

(56) References Cited

U.S. PATENT DOCUMENTS 9,046,952 B2 6/2015 Kim et al.
9,484,392 B2 11/2016 Lee et al.
(Continued)

FOREIGN PATENT DOCUMENTS

KR 10-2013-0072635 A 7/2013
KR 10-1750428 B1 6/2017
WO WO 2016/035819 A1 3/2016

*Primary Examiner* — Roy P Rabindranath
(74) *Attorney, Agent, or Firm* — Lewis Roca Rothgerber Christie LLP

(57) ABSTRACT

A display device includes a substrate including a display region including a plurality of pixels and a non-display region at one side of the display region; at least one transistor on the substrate; a light emitting element connected to the transistor; a thin film encapsulation layer covering the light emitting element; a plurality of light blocking patterns on the thin film encapsulation layer, the plurality of light blocking patterns corresponding to at least a portion of a non-emission region of each pixel, and a planarization layer covering the light blocking patterns; and a touch sensor including a plurality of touch electrodes on the planarization layer. None of the light blocking patterns overlap touch electrodes.

12 Claims, 9 Drawing Sheets

(56) References Cited

U.S. PATENT DOCUMENTS

| | | | |
|---|---|---|---|
| 2012/0242600 A1* | 9/2012 | Chiou | G06F 3/0412 345/173 |
| 2016/0266690 A1* | 9/2016 | Ahn | G06F 3/0412 |
| 2017/0090634 A1 | 3/2017 | Yang et al. | |
| 2017/0168391 A1 | 6/2017 | Yoshida et al. | |
| 2018/0331160 A1* | 11/2018 | Beak | H01L 27/323 |
| 2018/0350884 A1* | 12/2018 | Won | G06F 3/0412 |

* cited by examiner

DISPLAY DEVICE WITH A TOUCH SENSOR AND HAVING IMPROVED RELIABILITY AND VISIBILITY

CROSS-REFERENCE TO RELATED APPLICATION

Korean Patent Application No. 10-2017-0134186, filed on Oct. 16, 2017, in the Korean Intellectual Property Office, and entitled: "Display Device," is incorporated by reference herein in its entirety.

BACKGROUND

1. Field

An aspect of the present disclosure relates to a display device.

2. Description of the Related Art

Among display devices, organic light emitting displays including self-luminescent devices have a wide viewing angle, excellent contrast, fast response time, high brightness, and excellent driving voltage and response rate characteristics, and can realize a multicolor display.

An organic light emitting display device includes an organic light emitting element. In the organic light emitting element, electrons injected from one electrode and holes injected from the other electrode are combined in an organic emitting layer so as to form excitons, and the excitons emit light through energy emission. However, external light may be reflected by the organic light emitting element, degrading visibility of the organic light emitting display device.

SUMMARY

According to an aspect of the present disclosure, there is provided a display device including: a substrate including a display region in which a plurality of pixels are provided and a non-display region at one side of the display region: at least one transistor disposed on the substrate: a light emitting element including a first electrode connected to the transistor, an emitting layer disposed on the first electrode to emit light, and a second electrode disposed on the emitting layer; a thin film encapsulation layer provided over the light emitting element; a plurality of light blocking patterns disposed on the thin film encapsulation layer, the plurality of light blocking patterns corresponding to at least a portion of a non-emission region of each pixel, and a planarization layer covering the light blocking patterns; and a touch sensor including a plurality of touch electrodes disposed on the planarization layer, the plurality of touch electrodes sensing a touch of a user, wherein each light blocking pattern does not overlap with the touch electrodes.

The light blocking patterns may not overlap with the emitting layer of the light emitting element on the thin film encapsulation layer.

The plurality of touch electrodes may include: a touch electrode row including a plurality of first touch electrodes extending along a first direction; a touch electrode column including a plurality of second touch electrodes extending along a second direction intersecting the first direction. The touch sensor may include: a first connection pattern connecting one first touch electrode to an adjacent first touch electrode; and a second connection pattern connecting one second touch electrode to an adjacent second touch electrode.

When viewed on a plane, each light blocking pattern may not overlap with each of the first touch electrodes, the second touch electrodes, the first connection pattern, and the second connection pattern.

When viewed on a plane, each light blocking pattern may partially overlap with the first connection pattern and the second connection pattern.

The light blocking patterns may include a black matrix that absorbs external light.

The planarization layer may be between the thin film encapsulation layer and the touch sensor, and maintain the second electrode and the touch electrode to be spaced apart from each other at a certain distance.

The display device may further include a first buffer layer between the planarization layer and the touch sensor. The planarization layer may include an organic insulating material, and the first buffer layer may include an inorganic insulating material.

The display device may further include a second buffer layer between the substrate and the transistor. The second buffer layer may include the same material as the first buffer layer.

The thin film encapsulation layer may include a plurality of inorganic layers and a plurality of organic layers. The light blocking patterns may be on an inorganic layer disposed as the uppermost layer among the plurality of inorganic layers.

The display device may further include: a polarizing film on the touch sensor; and a window disposed on the polarizing film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
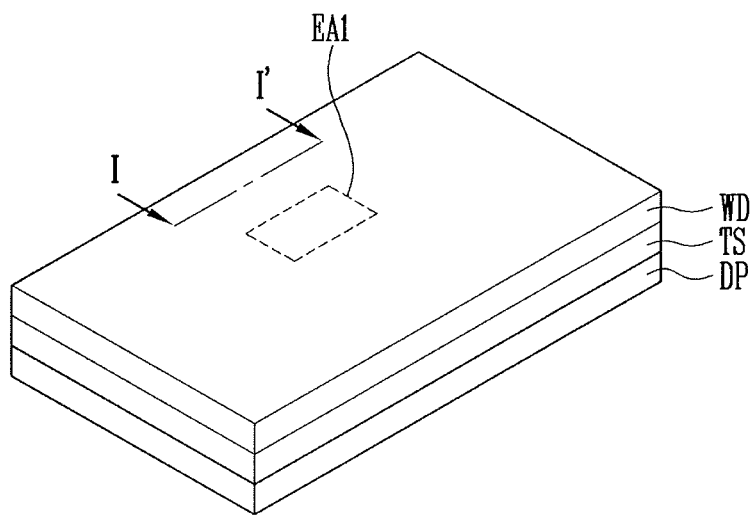
FIG. 1 illustrates a perspective view of a display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

Figure 2:
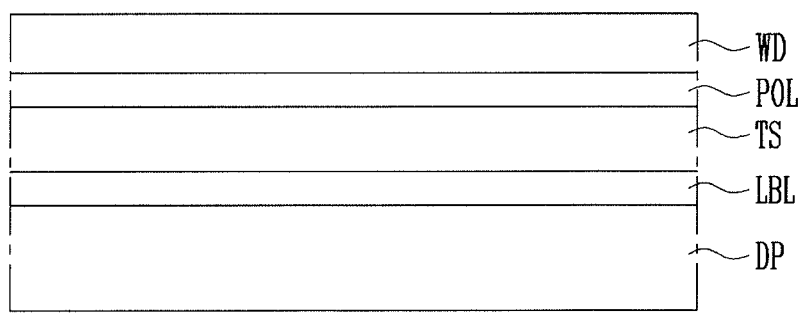
FIG. 2 illustrates a schematic sectional view of the display device shown in FIG. 1.
Figure 3:
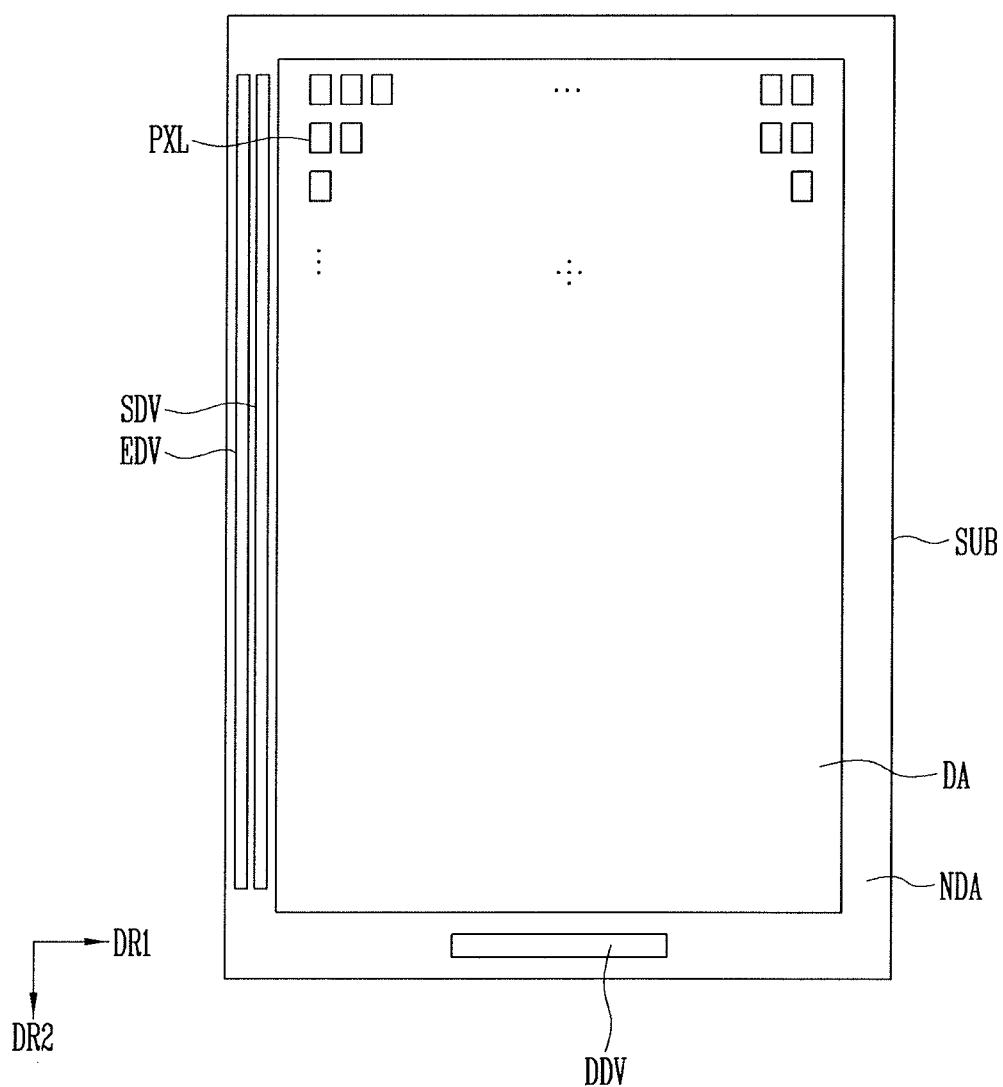
FIG. 3 illustrates a plan view of a display panel shown in FIG. 1.

FIG. 1 is a perspective view illustrating a display device according to an embodiment of the present disclosure. FIG. 2 is a schematic sectional view of the display device shown in FIG. 1. FIG. 3 is a plan view illustrating a display panel shown in FIG. 1.

Referring to FIGS. 1 to 3, the display device according to the embodiment of the present disclosure may be provided in various shapes. For example, the display device may have a quadrangular plate shape having two pairs of sides parallel to each other. When the display device has a rectangular plate shape, any one pair of sides among the two pairs of sides may be longer than the other pair of sides.

In an embodiment of the present disclosure, a case where the display device has a pair of long sides and a pair of short sides is illustrated for convenience of description. In this case, the extending direction of the short side is represented as a first direction DR1, and the extending direction of the long side is represented as a second direction DR2.

The display device may include a display panel DP, a touch sensor TS, and a window WD.

The display panel DP may display an image. The display panel DP is not particularly limited. For example, self-luminescent display panels such as an organic light emitting display panel (OLED panel) may be used as the display panel 100. In addition, non-luminescent display panel such as a liquid crystal display panel (LCD panel), an electrophoretic display panel (EPD panel), and an electro-wetting display panel (EWD panel) may be used as the display panel DP. When a non-luminescent display panel is used as the display panel 100, the display device may include a backlight unit that supplies light to the display panel DP. In the following embodiment, a case where the OLED panel is used as the display panel DP is described as an example.

The display panel DP may include a substrate SUB, pixels PXL, a driving unit, a power supply unit, a line unit, and the like. The substrate SUB may include a display region DA and a non-display region NDA.

The display region DA may be a region in which the pixels PXL for displaying an image are provided. Each pixel PXL will be described later.

The non-display region NDA is a region in which the pixels PXL are not provided, and is a region in which any image is not displayed. The non-display region NDA may be provided with the driving unit for driving the pixels PXL, the power supply unit for applying power to the pixels PXL, and portions of lines for connecting the driving unit to the pixels PXL. A portion of the non-display region NDA may correspond to a bezel in a final display device, and the width of the bezel may be determined according to the width of the non-display region NDA.

The pixels PXL may be provided in the display region DA. Each pixel PXL is a minimum unit for displaying an image, and a plurality of pixels PXL may be provided in the display region DA. Each pixel PXL may include a display element for emitting light. For example, the display element may be any one of a liquid crystal display (LCD) element, an electrophoretic display (EPD) element, an electrowetting display (EWD) element, and an organic light emitting display (OLED) element. Meanwhile, for convenience of description, a case where an OLED element is used as the display element is described as an example.

Each of the pixels PXL may emit light of any one of red, green, and blue, but the present disclosure is not limited thereto. For example, each of the pixels PXL may emit light of cyan, magenta, yellow, white, or the like. The pixels PXL may be arranged in a matrix form along rows extending in the first direction DR1 and columns extending in the second direction DR2. The arrangement form of the pixels PXL is not particularly limited, and the pixels PXL may be arranged in various forms.

The driving unit may provide a signal to each pixel PXL through the line unit, and control the pixel PXL to be driven according to the signal.

The driving unit may include a scan driver SDV for providing a scan signal to each pixel PXL along a scan line, an emission driver EDV for providing an emission control signal to each pixel PXL along an emission control line, a data driver DDV for providing a data signal to each pixel PXL along a data line, and a timing controller. The timing controller may control the scan driver SDV, the emission driver EDV, and the data driver DDV.

The data driver DDV may be in the non-display region NDA. In particular, the data driver DDV may be at a lateral part of the non-display region NDA. The data driver DDV may extend long along the width direction, i.e., the second direction, of the non-display region NDA. The scan driver SDV and the emission driver EDV may be in another lateral part of the non-display region NDA, e.g., may extend along the length direction, i.e., the first direction, of the non-display region NDA. In an embodiment of the present disclosure, the positions of the scan driver SDV, the emission driver EDV, and the data driver DDV may be changed, if necessary.

The timing controller may be connected, in various manners, to the scan driver SDV, the emission driver EDV, and the data driver DDV through lines. The position at which the timing controller is disposed is not particularly limited. For example, the timing controller may be mounted on a printed circuit board to be connected to the scan driver SDV, the emission driver EDV, and the data driver DDV through a flexible printed circuit board. The printed circuit board may be disposed at various positions such as one side of the substrate SUB and a back side of the substrate SUB.

The power supply unit may include at least one power supply line. For example, the power supply unit may include a first power supply line and a second power supply line. The power supply unit may supply power to each of the pixels PXL disposed in the display region DA. In an embodiment of the present disclosure, a voltage applied to the first power supply line may be higher than that applied to the second power supply line.

The touch sensor TS may be on at least one of both surfaces of the display panel DP. For example, the touch sensor TS may be on a surface of the display panel DP in the direction in which an image is emitted to receive a touch input of a user. Also, the touch sensor TS may be integrally formed with the display panel DP. In an embodiment of the present disclosure, a configuration in which the touch sensor TS is on a top surface of the display panel DP is described as an example.

The touch sensor TS may recognize a touch event from the display device through a finger of a user or a separate input means. In an embodiment of the present disclosure, the touch sensor TS may be driven using a mutual capacitance method. In the mutual capacitance method, a change in capacitance, caused by an interaction between two touch electrodes, is sensed. Also, the touch sensor TS may be driven using a self-capacitance method. In the self-capacitance method, when a user touches a region, a change in capacitance of a touch electrode in the touched region is sensed using touch electrodes arranged in a matrix shape and sensing lines connected to the respective sensing electrodes.

The touch sensor TS may include the touch electrode, the sensing line connected to the touch electrode, and a pad unit connected to one side of the sensing line. The touch sensor TS will be described later.

Although not shown in the drawings, an insulating layer may be disposed on the touch sensor TS. The insulating layer may cover the touch sensor TS and function to protect the touch sensor TS from the outside. In some embodiments, the insulating layer may include a material having elasticity to be deformed by a touch pressure of the user. In this case, the touch sensor TS may additionally include a pressure electrode that forms a capacitor together with the touch electrode.

The window WD may be on the touch sensor TS. The window WD may be made of a transparent material. The window WD may protect the exposed surface of the touch sensor TS. The window WD allows an image from the display panel DP to be transmitted therethrough and simultaneously reduces impact from the outside, so that it is possible to prevent the display panel DP from being damaged or erroneously operated due to the impact from the outside. Here, the impact from the outside refers to a force from the outside, such as stress, which causes a defect of the display panel DP. The whole or a least a portion of the window WD may have flexibility.

The display device according to the embodiment of the present disclosure may further include a polarizing film POL and a light blocking layer LBL. The polarizing film POL may be between the touch sensor TS and the window WD, and allow light emitted from the display panel DP to be polarized along a polarization axis.

The light blocking layer LBL may be between the display panel DP and the touch sensor TS, and may absorb light introduced into the display panel DP from the outside to block the external light to be introduced into the display element of the display panel DP. The light blocking layer LBL may include a plurality of light blocking patterns corresponding to the respective pixels PXL and a planarization layer that covers the light blocking patterns. The light blocking layer LBL will be described later with reference to FIG. 10.

Figure 4:
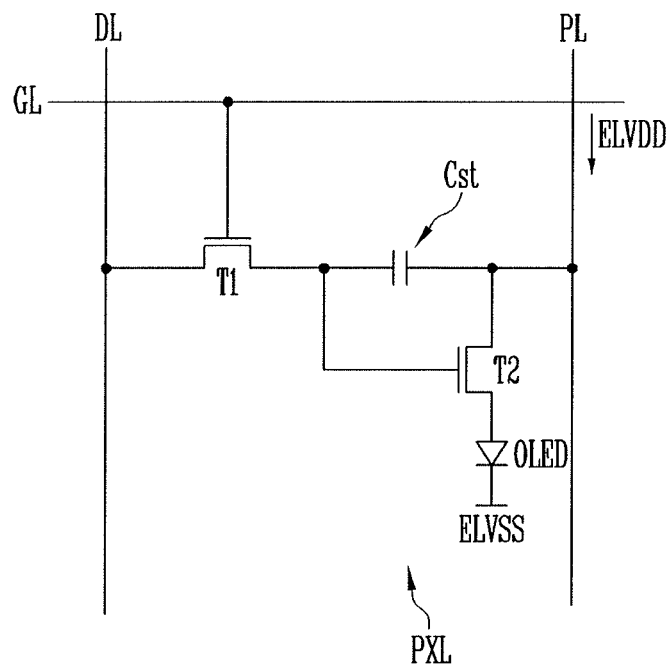
FIG. 4 illustrates an equivalent circuit diagram of one pixel among pixels shown in FIG. 3.

FIG. 4 is an equivalent circuit diagram illustrating one pixel among pixels shown in FIG. 3. For convenience of description, one pixel and lines connected thereto will be mainly illustrated in FIG. 4.

Referring to FIGS. 3 and 4, each pixel PXL may include a transistor connected to lines, a light emitting element OLED connected to the transistor, and a capacitor Cst. The light emitting element OLED may be a top-emission organic light emitting element or a bottom-emission organic light emitting element. The organic light emitting element may be an organic light emitting diode.

Each pixel PXL includes a pixel driving circuit for driving the light emitting element OLED, and may include a first transistor (or switching transistor) T1, a second transistor (or driving transistor) T2, and the capacitor Cst. A first power source ELVDD may be provided to the second transistor T2 through a power line PL, and a second power source ELVSS may be provided to the light emitting element OLED. The second power source ELVSS may be set to a voltage lower than that of the first power source ELVDD.

The first transistor T1 outputs a data signal applied to a data line DL in response to a scan signal applied to a gate line GL. The capacitor Cst charges a voltage corresponding to the data signal received from the first transistor T1. The second transistor T2 is connected to the light emitting element OLED. The second transistor T2 controls a driving current flowing through the light emitting element OLED, corresponding to a quantity of charges stored in the capacitor Cst.

In an embodiment of the present disclosure, it is illustrated that one pixel PXL includes two transistors T1 and T2. However, the present disclosure is not limited thereto, and one pixel PXL may include one transistor and one capacitor, or include three or more transistors and two or more capacitors. For example, one pixel PXL may include seven transistors, the light emitting element OLED, and the capacitor Cst.

Figure 5:
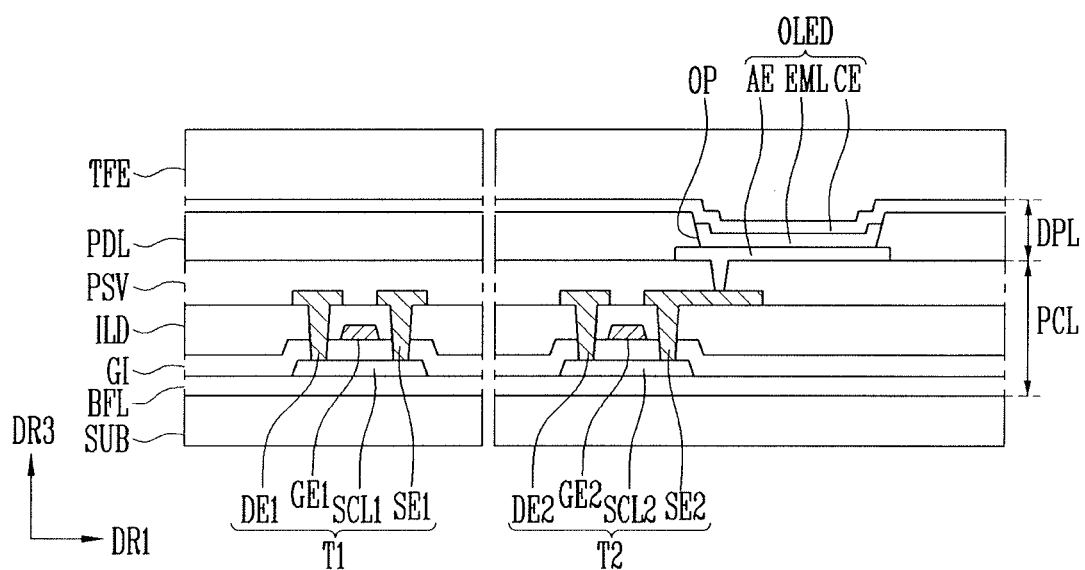
FIG. 5 illustrates a sectional view of a portion of a display panel according to an embodiment of the present disclosure.

FIG. 5 is a sectional view illustrating a portion of a display panel according to an embodiment of the present disclosure. Referring to FIG. 5, the display panel according to the embodiment of the present disclosure may include a substrate SUB, a pixel circuit unit PCL, a display element layer DPL, and a thin film encapsulation layer TFE stacked along a third direction DR3 that crosses the first and second directions DR1 and DR2.

The substrate SUB may be made of an insulating material, e.g., glass or resin. Also, the substrate SUB may be made of a material having flexibility to be bendable or foldable, and have a single- or multi-layered structure.

The substrate SUB may be a rigid substrate configured with glass or tempered glass, but may be a flexible substrate configured with a thin film made of a flexible plastic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed. In an embodiment, the substrate SUB may be made of a fiber reinforced plastic (FRP), etc. In an embodiment of the present disclosure, the substrate SUB may be made of a material having flexibility.

The pixel circuit unit PCL may include a buffer layer BFL on the substrate SUB, and first and second transistors T1 and T2 on the buffer layer BFL.

The buffer layer BFL may prevent an impurity from being diffused into the first and second transistors T1 and T2. The buffer layer BFL may be provided in a single layer, but may be provided in a multi-layer including at least two layers. When the buffer layer BFL is provided in the multi-layer, the layers may be formed of the same material or be formed of different materials. The buffer layer BFL may be omitted according to the material and process conditions of the substrate SUB.

The first transistor T1 may be a switching transistor for switching the second transistor T2. The second transistor T2 may be a driving transistor electrically connected to a light emitting element OLED of the display element layer DPL to drive the light emitting element OLED.

The first transistor T1 may include a first semiconductor layer SCL1, a first gate electrode GE1, a first source electrode SE1, and a first drain electrode DE1. The second transistor T2 may include a second semiconductor layer SCL2, a second gate electrode GE2, a second source electrode SE2, and a second drain electrode DE2.

The first and second semiconductor layers SCL1 and SCL2 may be on the buffer layer BFL. The first and second semiconductor layers SCL1 and SCL2 may include source regions and drain regions, which are in contact with the first and second source electrodes SE1 and SE2 and the first and second drain electrodes DE1 and DE2, respectively. A region between the source region and the drain region may be a channel region. Each of the first and second semiconductor layers SCL1 and SCL2 may be a semiconductor pattern made of poly-silicon, amorphous silicon, oxide semiconductor, etc. The channel region is a semiconductor pattern undoped with an impurity, and may be an intrinsic semiconductor. The source region and the drain region are semiconductor patterns doped with an impurity. The impurity may include impurities such as an n-type impurity, a p-type impurity, and other metals.

The first gate electrode GE1 may be on the first semiconductor layer SCL1 with a gate insulating layer GI interposed therebetween. The second gate electrode GE2 may be on the second semiconductor layer SCL2 with the gate insulating layer GI interposed therebetween. The gate insulating layer GI may be an inorganic insulating layer including an inorganic material, e.g., polysiloxane, silicon nitride, silicon oxide, silicon oxynitride, and the like.

The first source electrode SE1 and the first drain electrode DE1 may be in contact with the source region and the drain region of the first semiconductor layer SCL1 through contact holes passing through an interlayer insulating layer ILD and the gate insulating layer GI, respectively. The second source electrode SE2 and the second drain electrode DE2 may be in contact with the source region and the drain region of the second semiconductor layer SCL2 through contact holes passing through the interlayer insulating layer ILD and the gate insulating layer GI, respectively. The interlayer insulating layer ILD may be an inorganic insulating layer made of an inorganic material or an organic insulating layer made of an organic material.

The pixel circuit unit PCL may further include a passivation layer PSV over the first and second transistors T1 and T2 to cover the first and second transistors T1 and T2. The passivation layer PSV may include at least one of an inorganic insulating layer made of an inorganic material and an organic insulating layer made of an organic material. For example, the passivation layer PSV may include the inorganic insulating layer and the organic insulating layer on the inorganic insulating layer.

The display element layer DPL may include the light emitting element OLED on the passivation layer PSV. The light emitting element OLED may include first and second electrodes AE and CE, and an emitting layer EML disposed between the two electrodes AE and CE. Here, any one of the first and second electrodes AE and CE may be an anode electrode, and the other of the first and second electrodes AE and CE may be a cathode electrode. For example, the first electrode AE may be an anode electrode and the second electrode CE may be a cathode electrode. When the light emitting element OLED is a top-emission type organic light emitting element, the first electrode AE may be a reflective electrode, and the second electrode CE may be a transmissive electrode. Herein, a configuration in which the light emitting element OLED is a top-emission type organic light emitting element and the first electrode AE is an anode electrode is described as an example.

The first electrode AE may be connected to the second source electrode SE2 of the second transistor T2 through a contact hole passing through the passivation layer PSV. The first electrode AE may include a reflective layer capable of reflecting light and a transparent conductive layer on the top or bottom of the reflective layer, e.g., overlapping the first electrode AE along the third direction DR3. At least one of the transparent conductive layer and the reflective layer may be connected to the second source electrode SE2.

The display element layer DPL may further include a pixel defining layer PDL having an opening OP that allows a portion of the first electrode AE, e.g., a top surface of the first electrode AE to be exposed therethrough.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be on the exposed surface of the first electrode AE. The emitting layer EML may include a low-molecular or high-molecular material. In an embodiment of the present disclosure, the low-molecular material may include copper phthalocyanine (CuPc), N,N'-Di(naphthalene-1-yl)-N,N'-diphenyl-benzidine (NPB), tris-8-hydroxyquinoline aluminum ($Alq_3$), and the like. The high-molecular material may include poly(3,4-ethylenedioxythiophene (PEDOT)-, poly(phenylene-vinylene) (PPV)-, poly(fluorine)-based materials.

The emitting layer EML may be provided as a single layer, but may be provided as a multi-layer including various functions. When the emitting layer EML is provided as a multi-layer, the emitting layer EML may have a structure in which a hole injection layer, a hole transport layer, an emission layer, an electron transport layer, an electron injection layer, and the like are stacked in a single or complex structure. The present disclosure is not necessarily limited thereto, and the emitting layer EML may have various structures. In addition, at least a portion of the emitting layer EML may be integrally formed throughout a plurality of first electrodes AE, or be individually provided to correspond to each of the plurality of first electrodes AE. The color of light generated in the emitting layer EML may be one of red, green, blue, and white, but the present disclosure is not limited thereto. For example, the color of light generated in a light generation layer of the emitting layer EML may be one of magenta, cyan, and yellow.

The second electrode CE may be on the emitting layer EML. The second electrode CE may be a semi-transmissive reflective layer. For example, the second electrode CE may be a thin metal layer having a thickness, through which light emitted through the emitting layer EML can be transmitted. The second electrode CE may transmit a portion of the light emitted from the emitting layer EML therethrough, and may reflect the rest of the light emitted from the emitting layer EML.

The thin film encapsulation layer TFE may be disposed over the light emitting element OLED. The thin film encapsulation layer TFE may be provided as a single layer, but may be provided as a multi-layer. The thin film encapsulation layer TFE may include a plurality of insulating layers that cover the light emitting element OLED. Specifically, the thin film encapsulation layer TFE may include a plurality of inorganic layers and a plurality of organic layers. For example, the thin film encapsulation layer TFE may have a structure in which the inorganic layers and the organic layers are alternately stacked. Also, in some cases, the thin film encapsulation layer TFE may be an encapsulating substrate that is disposed over the light emitting element OLED and is joined together with the substrate SUB through a sealant.

Figure 6:
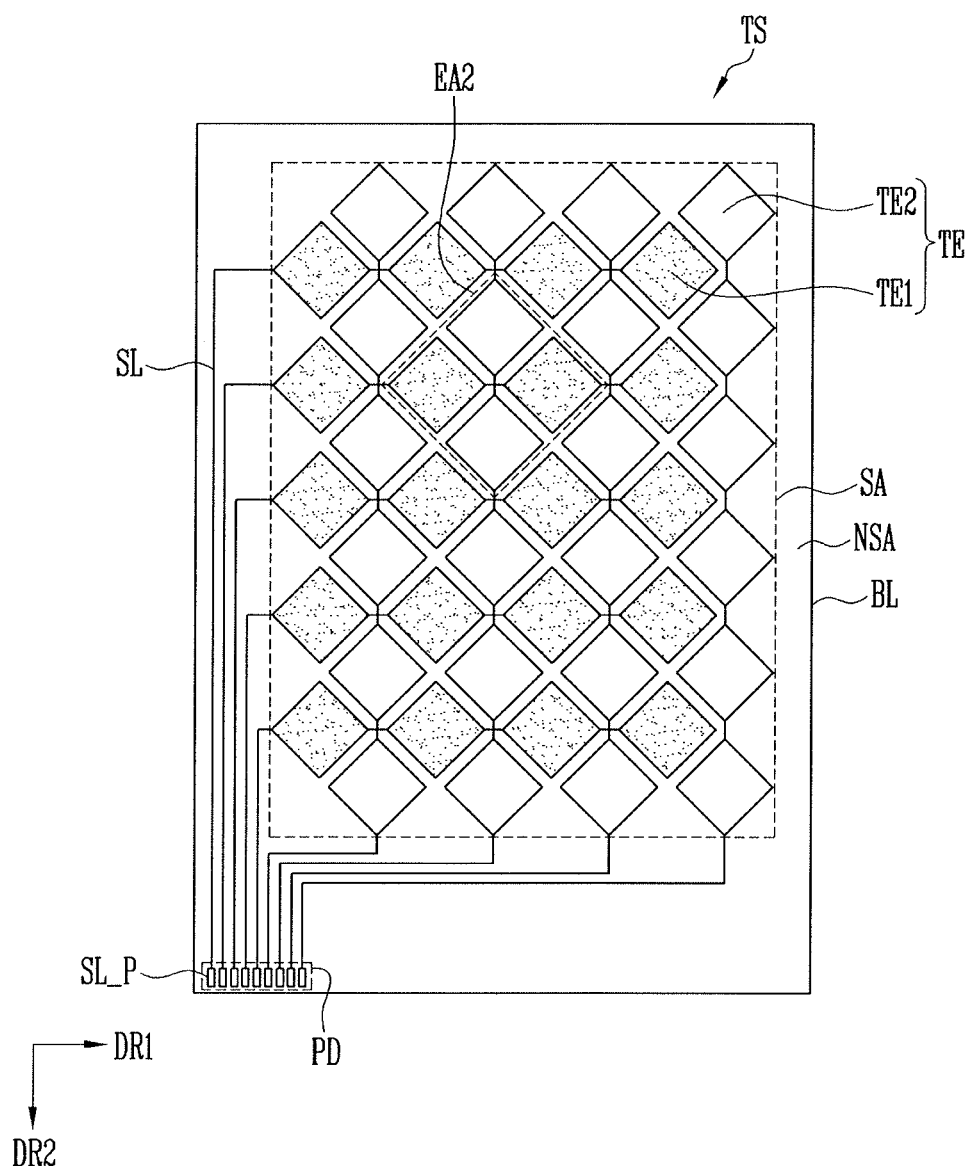
FIG. 6 illustrates a plan view of a touch sensor shown in FIG. 2.
Figure 7:
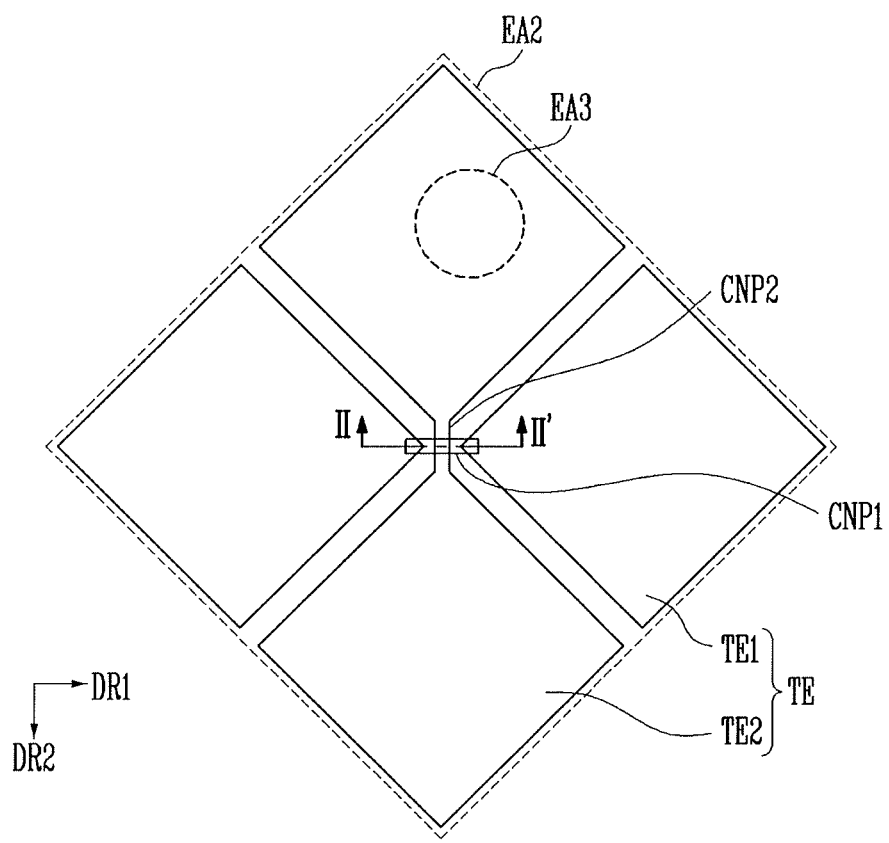
FIG. 7 illustrates an enlarged view of region EA2 of FIG. 6.
Figure 8:
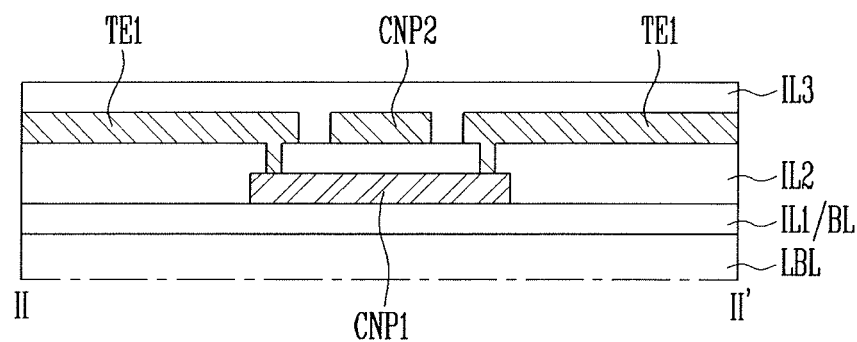
FIG. 8 illustrates a sectional view taken along line II-II' of FIG. 7.
Figure 9:
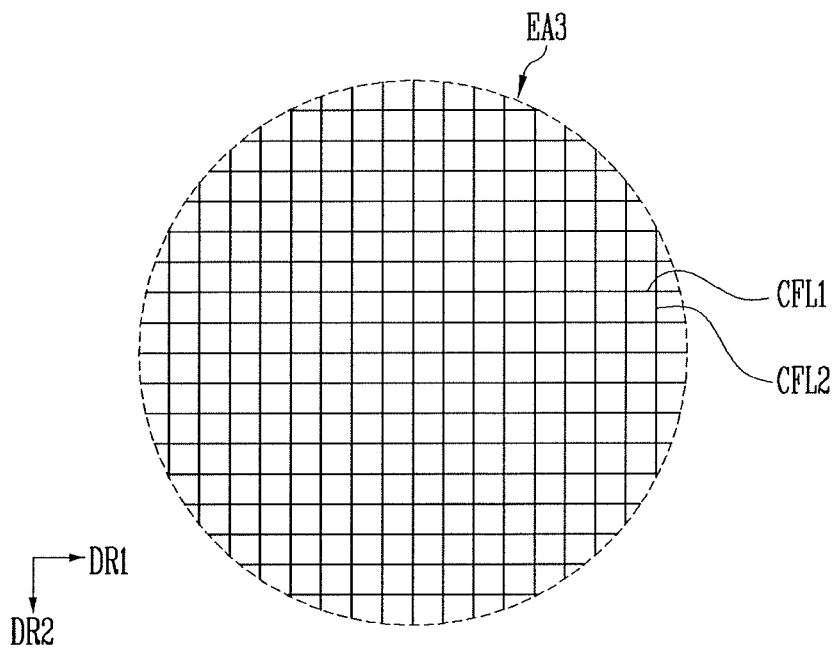
FIG. 9 illustrates an enlarged view of region EA3 of FIG. 7.

FIG. 6 is a plan view illustrating the touch sensor shown in FIG. 2. FIG. 7 is an enlarged view of region EA2 of FIG. 6. FIG. 8 is a sectional view taken along line II-II' of FIG. 7. FIG. 9 is an enlarged view of region EA3 of FIG. 7.

Referring to FIGS. 1 to 9, the touch sensor TS may include a base layer BL including a sensing region SA and a non-sensing region NSA.

The sensing region SA may overlap the display region DA of the display panel DP, and may be provided in a shape substantially identical to that of the display region DA. The non-sensing region NSA may overlap with the non-display region NDA of the display panel DP.

A plurality of touch electrodes TE may be provided in the sensing region SA, and a sensing line SL for connecting the touch electrodes TE to a pad unit PD in the non-sensing region NSA. The pad unit PD may include a plurality of pads SL_P. The pads SL_P may be electrically connected to a corresponding touch electrode TE through the sensing line SL.

Some of the touch electrodes TE may be arranged in the first direction DR1 and be electrically connected to each other, to constitute a plurality of touch electrode rows parallel to each other. The touch electrodes TE included in the touch electrode rows may be first touch electrodes TE1. In the touch electrode rows, adjacent first touch electrodes TE1 may be electrically connected to each other through a first connection pattern CNP1.

In addition, the others of the touch electrodes TE may be arranged in a second direction DR2 intersecting the first direction DR1 and be electrically connected to each other, to constitute a plurality of touch electrode columns parallel to each other. The touch electrodes TE included in the touch electrode columns may be second touch electrodes TE2. On the touch electrode columns, adjacent second touch electrodes TE2 may be electrically connected to each other through a second connection pattern CNP2. Each of the touch electrode rows and the touch electrode columns may be electrically connected to the pad unit PD through the sensing line SL.

One of the first touch electrode TE1 and the second touch electrode TE2 may receive a driving signal for touch sensing, which is applied through the sensing line SL, and the other of the first touch electrode TE1 and the second touch electrode TE2 may transfer a touch sensing signal through the sensing line SL. In an embodiment of the present disclosure, the first touch electrode TE1 may transfer the touch sensing signal, and the second touch electrode TE2 may receive the touch driving signal. The touch sensor TS may recognize a touch of a user by sensing a change in mutual capacitance formed between the first touch electrode TE1 and the second touch electrode TE2.

The touch sensor TS may include a first insulating layer IL1, a first conductive layer on the first insulating layer IL1, a second insulating layer IL2 covering the first conductive layer, a second conductive layer on the second insulating layer IL2, and a third insulating layer IL3 covering the second conductive layer.

The first insulating layer IL1 may be on a light blocking layer LBL. In an embodiment of the present disclosure, the first insulating layer IL1 may include at least one of an organic insulating layer including an organic material and an inorganic insulating layer including an inorganic material. For example, the first insulating layer IL1 may include at least one of silicon oxide, silicon nitride, and silicon oxynitride.

While the first conductive layer on the first insulating layer IL1 is described as an example, but the present disclosure is not limited thereto. For example, when the uppermost layer of the light blocking layer LBL includes an inorganic insulating material, the first insulating layer IL1 may be omitted, and the first conductive layer may be on the light blocking layer LBL.

The first conductive layer may include at least one of the first touch electrode TE1, the second touch electrode TE2, the first connection pattern CNP1, and the second connection pattern CNP2. For example, the first conductive layer may include the first connection pattern CNP1. The first conductive layer may include a conductive material layer. Here, the conductive material layer may include a transparent conductive oxide or a metallic material. Also, the first conductive layer may include a plurality of stacked metal layers. The transparent conductive oxide may include indium tin oxide (ITO), indium zinc oxide (IZO), antimony zinc oxide (AZO), indium tin zinc oxide (ITZO), zinc oxide (ZnO), tin oxide ($SnO_2$), and the like. The metallic material may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like.

The second insulating layer IL2 may be on the first insulating layer IL1 on which the first conductive layer including the first connection pattern CNP1 is disposed. The second insulating layer IL2 may include the same material as the first insulating layer IL1, but the present disclosure is not limited thereto. In an embodiment of the present disclosure, the second insulating layer IL2 may include at least one of an organic insulating layer and an inorganic insulating layer.

Like the first conductive layer, the second conductive layer may include one conductive material layer. Alternatively, the second conductive layer may include a plurality of stacked conductive material layers. In an embodiment of the present disclosure, the second conductive layer may include the first touch electrode TE1, the second touch electrode TE2, and the second connection pattern CNP2.

The third insulating layer IL3 may be on the second insulating layer IL2 on which the second conductive layer is disposed. The third insulating layer IL3 may prevent corrosion of the second layer by preventing the second conductive layer from being exposed to the outside.

The third insulating layer IL3 may be an organic insulating layer including an organic material, e.g., one of acryl, polyimide (PI), polyamide (PA), and benzocyclobutene (BCB). When the third insulating layer IL3 including the organic insulating layer is transparent and flexible, the third insulating layer IL3 may reduce and planarize winding, e.g., unevenness, of a lower structure.

In an embodiment of the present disclosure, the first connection pattern CNP1 is included in the first conductive layer and the second connection pattern CNP2 is included in the second conductive layer is described as an example, but the present disclosure is not limited thereto. For example, the second connection pattern CNP2 may be included in the first conductive layer, and the first connection pattern CNP1 may be included in the second conductive layer.

Also, in an embodiment of the present disclosure, a case where the first conductive layer is on the first insulating layer IL1 and the second conductive layer is on the second insulating layer IL2 is described as an example, but the present disclosure is not limited thereto. For example, the first conductive layer may be on the second insulating layer IL2, and the second conductive layer may be on the first insulating layer IL1.

Also, in an embodiment of the present disclosure, the first touch electrode TE1 and the second touch electrode TE2 are on the same layer, but the present disclosure is not limited thereto. For example, the first touch electrode TE1 and the second touch electrode TE2 may be on different layers.

The second touch electrode TE2 may include a plurality of conductive fine lines as shown in FIG. 9. As an example, the second touch electrode TE2 may include a plurality of first conductive fine lines CFL1 that extend in the first direction DR1 and are parallel to one another and a plurality of second conductive fine lines CFL2 that extend in the second direction DR2 and are parallel to one another. The second touch electrode TE may have a mesh structure due to the first conductive fine lines CFL1 and the second conductive fine lines CFL2. The mesh structure may include a plurality of openings, e.g., regions formed as the first conductive fine lines CFL1 and the second conductive fine lines CFL2 intersect each other.

In the drawing, the second touch electrode TE2 is illustrated as having a mesh structure, but the present disclosure is not limited thereto. For example, each of the first touch electrode TE1, the first connection pattern CNP1, and the second connection pattern CNP2 may also include the plurality of conductive fine lines CFL.

When the first touch electrode TE1 and the second touch electrode TE2 have a mesh structure, the area in which the first touch electrode TE1 and the second touch electrode TE2 overlap with each other may be decreased by the openings. If the area in which the first touch electrode TE1 and the second touch electrode TE2 overlap with each other is decreased, it is possible to prevent electromagnetic interference between the first and second touch electrodes TE1 and TE2 and the display panel DP. Thus, the touch recognition rate of the touch sensor TS can be improved.

Figure 10:
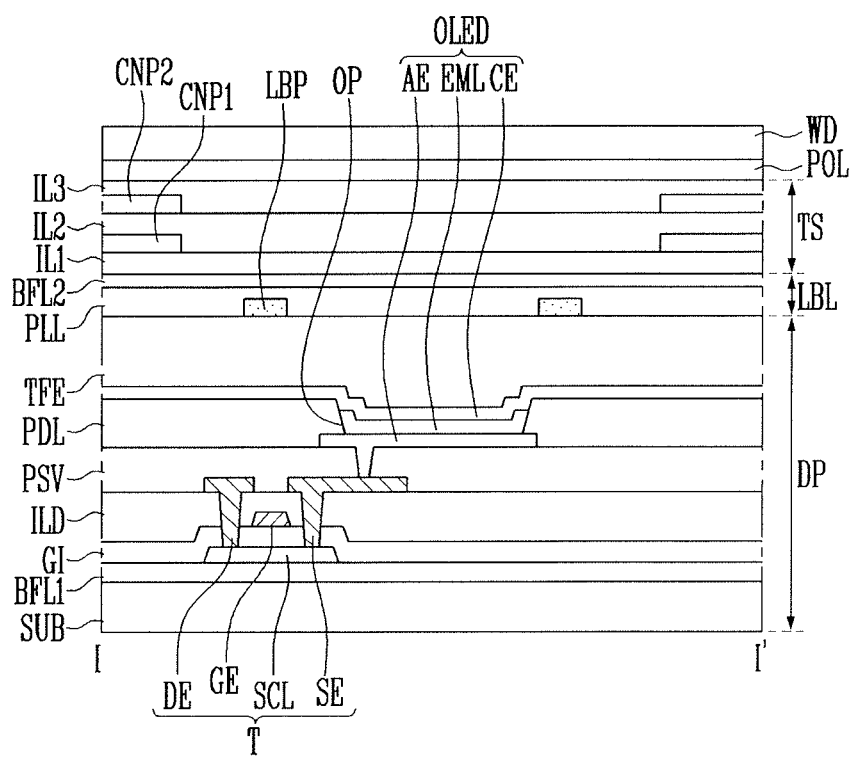
FIG. 10 illustrates a sectional view taken along line I-I' of FIG. 1.

FIG. 10 is a sectional view taken along line I-I' of FIG. 1. Referring to FIGS. 1 and 10, the display device according to the embodiment of the present disclosure may include a display panel DP, a touch sensor TS, a polarizing film POL, and a window WD stacked along the third direction DR3. The display panel DP may include a substrate SUB, at least one transistor T on the substrate SUB, and a light emitting element OLED connected to the transistor T.

The substrate SUB may include a transparent insulating material and be a rigid substrate or a flexible substrate. The rigid substrate may include a glass substrate, a quartz substrate, a glass ceramic substrate, and a crystalline glass substrate. The flexible substrate may include a film substrate and a plastic substrate, which include a polymer organic material. The material applied to the substrate SUB may have resistance (or heat resistance) against high processing temperature in a manufacturing process of the display device.

A first buffer layer BFL1 may be between the substrate SUB and the transistor T. The first buffer layer BFL1 may be an inorganic insulating layer including an inorganic material. For example, the first buffer layer BFL1 may include at least one of silicon oxide, silicon nitride, and silicon oxynitride. Also, the first buffer layer BFL1 may be a single layer or a multi-layer. The first buffer layer BFL1 may prevent an impurity from being diffused into the transistor T from the substrate SUB.

The transistor T may be connected to a gate line and a data line. The transistor T may include a semiconductor layer SCL, a gate electrode GE, a source electrode SE, and a drain electrode DE.

The semiconductor layer SCL may be on the first buffer layer BFL1. The semiconductor layer SCL may include one of amorphous Si, polycrystalline Si, oxide semiconductor, and organic semiconductor. In the semiconductor layer SCL, regions connected to the source electrode SE and the drain electrode DE may be source and drain regions into which an impurity is doped or injected. A region between the source region and the drain region may be a channel region.

A gate insulating layer GI may be disposed over the semiconductor layer SCL. The gate insulating layer GI may cover the semiconductor layer SCL and allow the semiconductor layer SCL and the gate electrode GE to be insulated from each other.

The gate electrode GE may be on the gate insulating layer GI. The gate electrode GE may be connected to the gate line. The gate electrode GE may include a low-resistance conductive material and overlap with the semiconductor layer SCL.

An interlayer insulating layer ILD may be on the gate electrode GE. The interlayer insulating layer ILD may allow the source electrode SE and the drain electrode DE to be insulated from the gate electrode GE.

Contact holes passing through the gate insulation layer GI and the interlayer insulating layer ILD may allow the source region and the drain region of the semiconductor layer SCL to be exposed therethrough.

A passivation layer PSV may be disposed over the transistor T. The passivation layer PSV may include an inorganic passivation layer and an organic passivation layer on the inorganic passivation layer. The inorganic passivation layer may include at least one of silicon oxide and silicon nitride. The organic passivation layer may include one of acryl, polyimide (PI), polyamide (PA), and benzocyclobutene (BCB). The light emitting element OLED may be on the passivation layer PSV.

A first electrode AE connected to the transistor T may be on the passivation layer PSV, and a pixel defining layer PDL including an opening that allows a top surface of the first electrode AE to be exposed therethrough may be disposed over the first electrode AE. An emitting layer EML may be on the exposed surface of the first electrode AE and a second electrode CE may be on the emitting layer EML.

A thin film encapsulation layer TFE covering the second electrode CE may be disposed over the second electrode CE. The thin film encapsulation layer TFE may include a plurality of inorganic layers and a plurality of organic layers.

The touch sensor TS may be on the top of the display panel DP and sense a touch input of a user. The touch sensor TS may include a conductive pattern including a plurality of touch electrodes (see TE of FIG. 7) and connection patterns CNP1 and CNP2, and first to third insulating layers IL1, IL2, and IL3.

In an embodiment of the present disclosure, the connection patterns CNP1 and CNP2 may include a first connection pattern CNP1 and a second connection pattern CNP2, which are provided in different layers with the second insulating layer IL2 interposed therebetween.

The first connection pattern CNP1 may be on the first insulating layer IL1. The first connection pattern CNP1 may connect one first touch electrode (see TE1 of FIG. 7) on a touch electrode row among the touch electrodes TE to an adjacent first touch electrode TE1.

The second insulating layer IL2 may be over the first connection pattern CNP1. The second insulating layer IL2 may cover the first connection pattern CNP1 and protect the first connection pattern CNP1 from the outside. The second insulating layer IL1 may be any one of an inorganic insulating layer including an inorganic material and an organic insulating layer including an organic material.

The second connection pattern CNP2 may be on the second insulating layer IL2. The second connection pattern CNP2 may connect one second touch electrode (see TE2 of FIG. 7) on a touch electrode column among the touch electrodes TE to an adjacent second touch electrode TE2.

The third insulating layer IL3 may be over the second connection pattern CNP2. The third insulating layer IL3 may cover the second connection pattern CNP2 and protect the second connection pattern CNP2 from the outside.

As shown in the drawing, the first connection pattern CNP1 and the second connection pattern CNP2 may overlap each other, along the third direction DR3, with the second insulating layer IL2 interposed therebetween.

The polarizing film POL may be on the touch sensor TS having the above-described configuration. The polarizing film POL may be on the touch sensor TS with a first adhesive therebetween. The polarizing film POL may have a polarization axis and linearly polarize in a direction perpendicular to the polarization axis. For example, the polarizing film POL may allow light corresponding to the polarization axis to be absorbed therein and allow light perpendicular to the polarization axis to be pass therethrough. Therefore, when light passes through the polarizing film POL, the light may be linearly polarized in the direction perpendicular to the polarizing axis.

The polarizing film POL may be a layer formed by adsorbing and aligning a dichroic pigment on a uniaxially stretched polyvinyl alcohol-based resin. The polyvinyl alcohol-based resin may be modified, and may be used as, for example, polyvinyl formalin, polyvinyl acetal, polyvinyl butyral, or the like, which is degenerated as aldehydes. Examples of the dichroic pigment may be iodine, an organic dye, and the like. The polarizing film POL may be provided in the form of polyvinyl alcohol, polypropylene, etc., a layer formed through coating, a metal pattern layer such as a wire grid polarizer (WGP), or the like.

The window WD may be attached to the polarizing film POL with a second adhesive interposed therebetween to protect the touch sensor TS and the display panel DP.

The window WD may be provided in a plate shape corresponding to the shape of the display panel DP and the touch sensor TS and cover a front surface of the touch sensor TS. For example, when the touch sensor TS is provided in a rectangular shape, the window WD may also be provided in a rectangular shape corresponding to that of the touch sensor TS. Alternatively, when the touch sensor TS is provided in a circular shape, the window WD may be provided in a circular shape corresponding to that of the touch sensor TS.

The window WD allows an image from the display panel DP to be transmitted therethrough and simultaneously reduces impact from the outside, so that it is possible to prevent the display panel DP from being damaged or erroneously operated due to the impact from the outside.

The display device according to the embodiment of the present disclosure may further include a light block layer LBL between the display panel DP and the touch sensor TS. The light blocking layer LBL may be on an inorganic layer disposed as the uppermost layer among the plurality of inorganic layers included in the thin film encapsulation layer TFE.

In an embodiment of the present disclosure, the light blocking layer LBL may include a light blocking pattern LBP and a planarization layer PLL covering the light blocking pattern LBP. The light blocking pattern LBP may include a material that has a certain dielectric constant and absorbs external light incident into the display panel DP from the outside or reflected by the display panel DP. For example, the light blocking pattern LBP may include a black matrix.

The light blocking pattern LBP may be on the thin film encapsulation layer TFE of the display panel DP and may be provided in plurality. The light blocking pattern LBP may protrude toward the touch sensor TS from the thin film encapsulation layer TFE and correspond to a partial region of each pixel (see PXL of FIG. 3) of the display panel DP. Specifically, the light blocking pattern LBP may be on the thin film encapsulation layer TFE not to overlap with an emission region of the light emitting element OLED included in each pixel PXL. That is, the light blocking pattern LBP may be on the thin film encapsulation layer TFE to correspond to a non-emission region of each pixel PXL without overlapping with the emitting regions EML along the third direction DR3.

The light blocking pattern LBP may absorb light introduced into the display panel DP from the outside and absorb light reflected by the light emitting element OLED of the display panel DP. Accordingly, the reflectivity of external light in each pixel PXL can be decreased, and it is possible to reduce a phenomenon that the transistor T disposed under the light emitting element OLED is viewed to the outside.

In addition, the light blocking pattern LBP may be on the thin film encapsulation layer TFE not to overlap, e.g., along the third direction DR3, with the first and second connection patterns CNP1 and CNP2 of the touch sensor TS or the touch electrode TE1 and TE2. This is to prevent a touch signal applied to the first and second connection patterns CNP1 and CNP2 from being influenced by the dielectric constant of the light blocking pattern LBP. Here, the dielectric constant of the light blocking pattern LBP may be approximately 3 (ε), but the present disclosure is not limited thereto. The dielectric constant of the light blocking pattern LBP and a thickness of the light blocking layer LBL may be set within a range where touch characteristics of the touch sensor TS are not deteriorated as the touch signal applied to the first and second connection patterns CNP1 and CNP2 is influenced by the light blocking pattern LBP.

Figure 11:
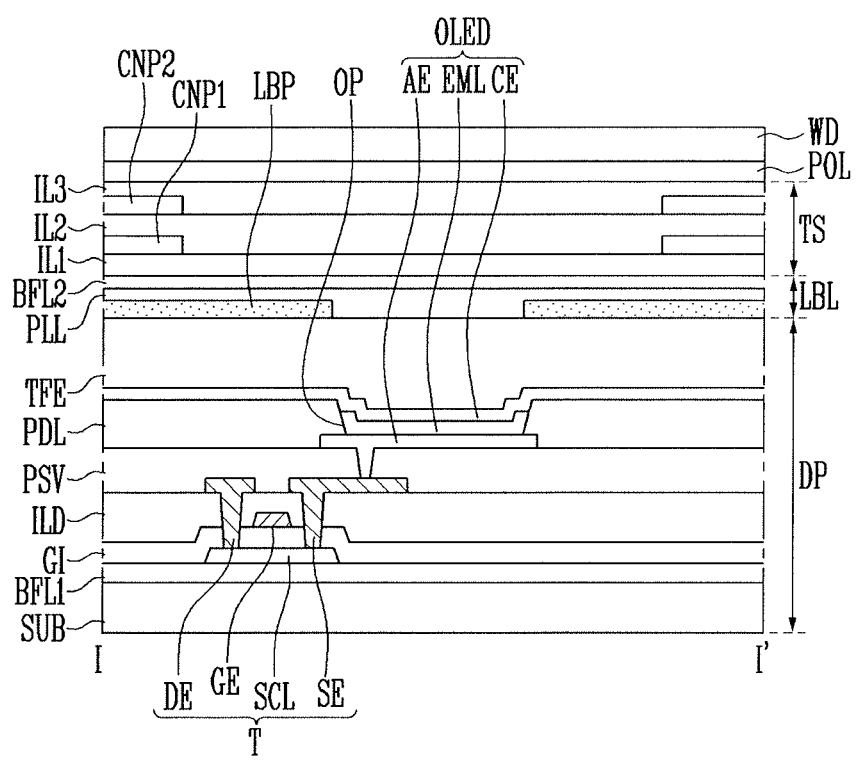
FIG. 11 illustrates a light blocking pattern according to another embodiment of the present disclosure, which is a sectional view corresponding to the line I-I' of FIG. 1.

In an embodiment of the present disclosure, the light blocking pattern LBP is on the thin film encapsulation layer TFE and does not overlap with the first and second connection patterns CNP1 and CNP2, e.g., along the third direction DR3, but the present disclosure is not limited thereto. In some embodiments, the light blocking pattern LBP, as shown in FIG. 11, may be on the thin film encapsulation layer TFE to overlap with the first and second connection patterns CNP1 and CNP2 of the touch sensor TS, but not the touch electrode TE1 and TE2. In this case, since the area of the light blocking pattern LBP is increased, the light blocking pattern LBP can sufficiently absorb light introduced into the display panel DP from the outside. In addition, although the light introduced into the display panel DP from the outside is reflected by the light emitting element OLED, a portion of the light can be absorbed by the light blocking pattern LBP of which the area is increased. Thus, the reflectivity of external light in each pixel PXL can be decreased, and the viewing angle luminance ratio of each pixel can be increased. Consequently, the image quality of the display device can be improved.

The planarization layer PLL may planarize a surface of the light blocking layer LBL such that the touch sensor TS on the top of the planarization layer PLL is not influenced by the shape of the light blocking pattern LBP. Here, the planarization layer PLL may be an organic insulating layer made of an organic material having flatness to a degree sufficient to planarize the surface of the light blocking layer LBL. The organic material may include a polyacryl-based compound, a polyimide-based compound, a fluorine-based compound such as Teflon, a benzocyclobutene-based compound, and the like. The planarization layer PLL may entirely or partially fill openings between adjacent light blocking patterns LBP.

In an embodiment of the present disclosure, the planarization layer PLL may maintain the touch sensor TS and the display panel DP to be spaced apart from each other at a certain distance. Specifically, the planarization layer PLL may maintain the touch sensor TS and the second electrode CE of the light emitting element OLED to be spaced apart from each other at a certain distance along the third direction DR3.

In general, a parasitic capacitance may be generated between the touch sensor TS and the second electrode CE. The parasitic capacitance has influence on a touch signal of the touch sensor TS, and therefore, the touch recognition rate of the touch sensor may be decreased. The parasitic capacitance may decrease as the distance between the touch sensor TS and the second electrode CE increases.

In an embodiment of the present disclosure, since the light blocking layer LBL is between the touch sensor TS and the second electrode CE, the distance between the touch sensor TS and the second electrode CE can be further ensured. Accordingly, the parasitic capacitance generated between the touch sensor TS and the second electrode CE is decreased, so that the touch recognition rate of the touch sensor TS can be improved.

The light blocking layer LBL may further include a second buffer layer BFL2 disposed between the planarization layer PLL and the touch sensor TS. The second buffer layer BFL2 may include the same material as the first buffer layer BFL1. For example, the second buffer layer BFL2 may be an inorganic insulating layer including an inorganic material.

The second buffer layer BFL2 may be on the planarization layer PLL may include the organic insulating layer to block moisture or oxygen from penetrating into the planarization layer PLL. Also, the second buffer layer BFL2 may be on the planarization layer PLL and may include the organic insulating layer so as to smoothly manufacture the touch sensor TS.

Figure 12:
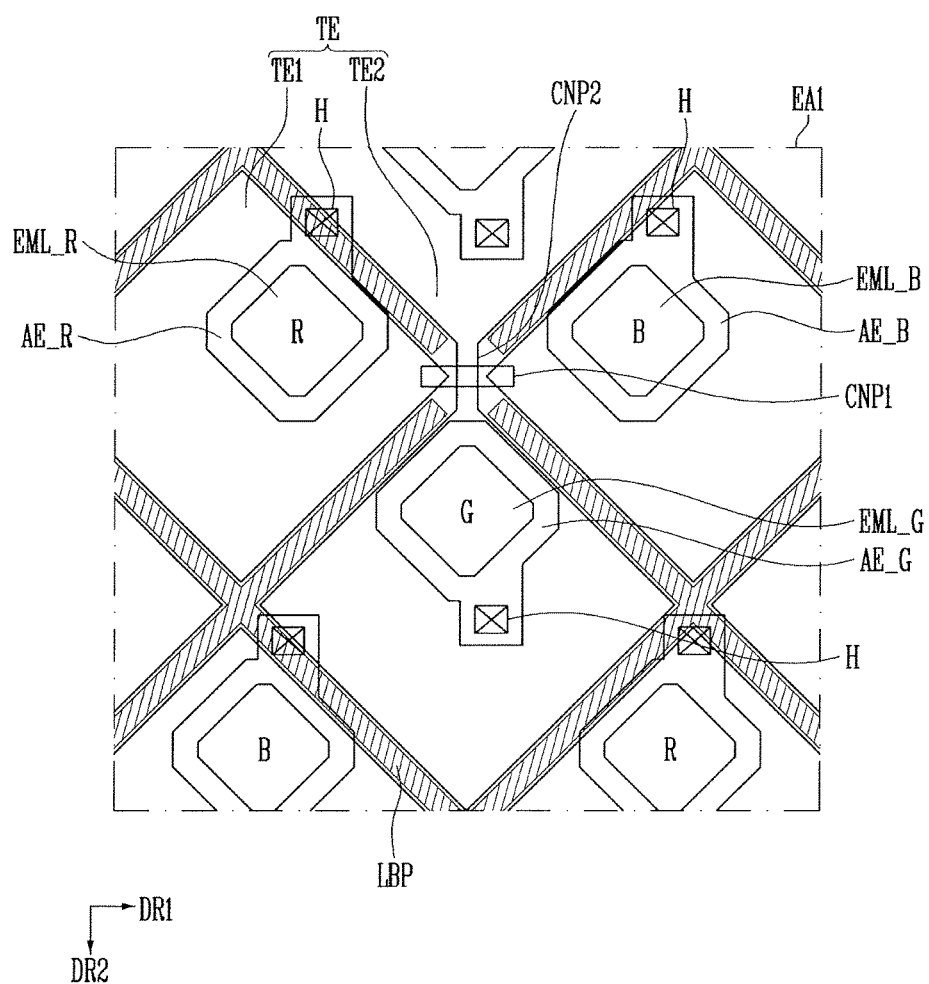
FIGS. 12 and 13 illustrate enlarged plan views of region EA1 of FIG. 1, which schematically illustrate an arrangement structure of light blocking patterns according to an embodiment of the present disclosure.
Figure 13:
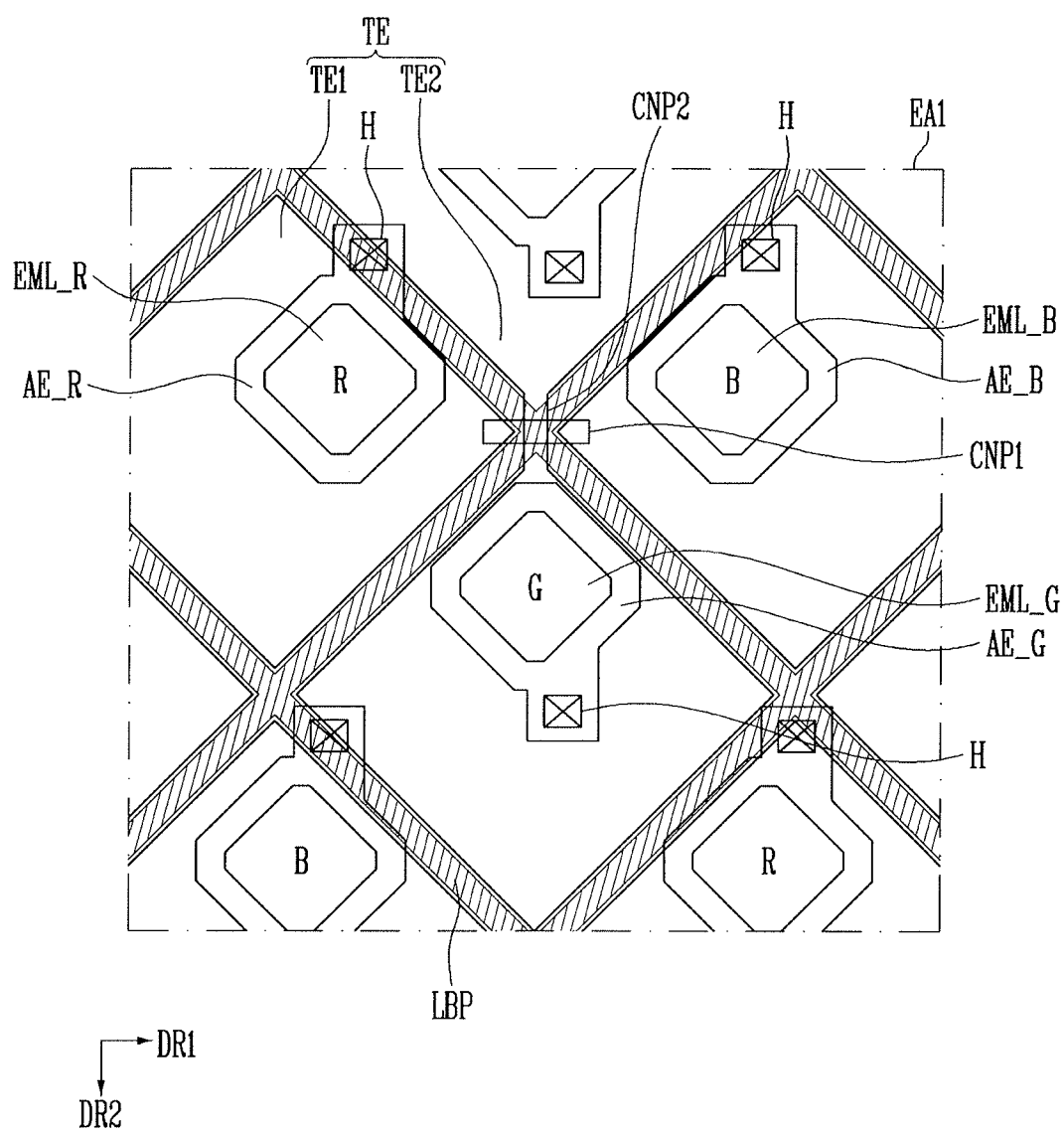

FIGS. 12 and 13 are enlarged plan views of region EA1 of FIG. 1, which schematically illustrate an arrangement structure of light blocking patterns according to an embodiment of the present disclosure.

In FIGS. 12 and 13, the illustration of lines connected to a plurality of pixels is omitted for convenience of description. In order to decrease the reflectivity of external light introduced into each pixel and improve the touch recognition rate of the touch sensor, light blocking patterns may be arranged at various positions and/or various densities per unit area according to sizes of touch electrodes, touch forms of a user, and images displayed in the display panel.

Referring to FIGS. 1, 12, and 13, the display device according to the embodiment of the present disclosure may include a substrate SUB on which first to third pixels R, G, and B are provided. In an embodiment of the present disclosure, the first pixel R may be a pixel that emits red light, the second pixel G may be a pixel that emits green light, and the third pixel B may be a pixel that emits blue light. However, the present disclosure is not limited thereto.

The first pixel R may include a first electrode AE_R for the first pixel and an emitting layer EML_R for the first pixel, which emits the red light. The first electrode AE_R for the first pixel may be connected to a driving transistor disposed in the first pixel R.

The second pixel G may include a first electrode AE_G for the second pixel and an emitting layer EML_G for the second pixel, which emits the green light. The first electrode AE_G for the second pixel may be connected to a driving transistor disposed in the second pixel G.

The third pixel B may include a first electrode AE_B for the third pixel and an emitting layer EML_B for the third pixel, which emits the blue light. The first electrode AE_B for the third pixel may be connected to a driving transistor disposed in the third pixel B.

A touch electrode TE may be disposed on the substrate SUB on which the first to third pixels R, G, and B. The touch electrode TE may include first touch electrodes TE1 consecutively arranged in a first direction (e.g., a row direction) and second touch electrodes TE2 consecutively arranged in a second direction intersecting (e.g., a column direction) the first direction. Also, the touch electrode TE may include a first connection pattern CNP1 that connects one first touch electrode TE1 to an adjacent first touch electrode TE1 and a second connection pattern CNP2 that connects one second touch electrode TE2 to an adjacent second touch electrode TE2.

Meanwhile, a light blocking pattern LBP may be on the substrate SUB. The light blocking pattern LBP may include a material that has a certain dielectric constant and absorbs external light incident into the display device from the outside or reflected by the display device. For example, the light blocking pattern LBP may include a black matrix.

The light blocking pattern LBP may be provided in a non-emission region of the substrate SUB, e.g., each light blocking pattern LBP may be in a non-emission region of each pixel PXL along the third direction DR3. In an embodiment of the present disclosure, the non-emission region may be a region except an emission region in which light is emitted by the emitting layer EML_R for the first pixel, the emitting layer EML_G for the second pixel, and the emitting layer EML_B for the third pixel.

In addition, the light blocking pattern LBP may be on the substrate SUB not to overlap with the touch electrode TE along the third direction. Specifically, the light blocking pattern LBP may be in the non-emission region of the substrate SUB not to overlap with the touch electrode TE when viewed on a plane.

In an embodiment of the present disclosure, as shown in FIG. 12, the light blocking pattern LBP may be provided in a region in which the first touch electrode TE1 and the second touch electrode T2 are spaced apart from each other in the non-emission region of the substrate SUB. This is for the purpose that a touch signal applied to the touch electrode TE is not influenced by the dielectric constant of the light blocking pattern LBP.

As the light blocking pattern LBP is provided in the non-emission region of the substrate SUB, light introduced into the display device from the outside may be absorbed by the light blocking pattern LBP, and light reflected by the first to third pixels R, G, and B may also be absorbed by the light blocking pattern LBP. Accordingly, the reflectivity of external light in each of the first to third pixels R, G, and B can be decreased.

In some embodiments, as shown in FIG. 13, the light blocking pattern LBP may overlap with the touch electrode TE as the area of the light blocking pattern LBP is designed to be large such that light introduced into the display device is sufficiently absorbed. In this case, the light blocking pattern LBP may overlap with the first and second connection patterns CNP1 and CNP2 in the non-emission region of the substrate SUB when viewed on a plane. In an embodiment of the present disclosure, it is illustrated that the light shielding pattern LBP overlaps with the first and second connection patterns CNP1 and CNP2, but the present disclosure is not limited thereto. For example, the light blocking pattern LBP may be provided in the non-emission region of the substrate SUB to overlap with the first touch electrode TE1 and/or the second touch electrode TE2 within a range where a touch signal applied to the touch electrode TE is not influenced by the dielectric constant of the light blocking pattern LBP.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

According to the present disclosure, it is possible to provide a display device with a touch sensor having improved reliability and visibility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a substrate including a display region in which a plurality of pixels are provided and a non-display region at one side of the display region;
   at least one transistor on the substrate;
   a light emitting element including a first electrode connected to the transistor, an emitting layer on the first electrode to emit light, and a second electrode on the emitting layer;
   a thin film encapsulation layer on the light emitting element;
   a plurality of light blocking patterns on the thin film encapsulation layer, the plurality of light blocking patterns corresponding to at least a portion of a non-emission region of each pixel;
   a planarization layer covering the plurality of light blocking patterns; and
   a touch sensor including a plurality of touch electrodes on the planarization layer, the plurality of touch electrodes sensing a touch of a user,
   wherein none of the plurality of light blocking patterns overlaps the plurality of touch electrodes when viewed on a plane.

2. The display device as claimed in claim 1, wherein the light blocking patterns do not overlap the emitting layer of the light emitting element on the thin film encapsulation layer.

3. The display device as claimed in claim 1, wherein the plurality of touch electrodes includes:
   a touch electrode row including a plurality of first touch electrodes extending along a first direction; and
   a touch electrode column including a plurality of second touch electrodes extending along a second direction intersecting the first direction, and
   wherein the touch sensor includes:

a first connection pattern connecting one first touch electrode to an adjacent first touch electrode; and a second connection pattern connecting one second touch electrode to an adjacent second touch electrode.

4. The display device as claimed in claim 1, wherein the light blocking patterns include a black matrix that absorbs external light.

5. The display device as claimed in claim 1, wherein the planarization layer is between the thin film encapsulation layer and the touch sensor, and maintains the second electrode and the touch electrodes to be spaced apart from each other at a certain distance.

6. The display device as claimed in claim 5, further comprising a first buffer layer between the planarization layer and the touch sensor.

7. The display device as claimed in claim 6, wherein the planarization layer includes an organic insulating material, and wherein the first buffer layer includes an inorganic insulating material.

8. The display device as claimed in claim 7, further comprising a second buffer layer between the substrate and the transistor, wherein the second buffer layer includes a same material as the first buffer layer.

9. The display device as claimed in claim 1, wherein the thin film encapsulation layer includes a plurality of inorganic layers and a plurality of organic layers, and wherein the light blocking patterns are on an inorganic layer disposed as an uppermost layer among the plurality of inorganic layers.

10. The display device as claimed in claim 1, further comprising:

a polarizing film on the touch sensor; and a window on the polarizing film.

11. A display device comprising:

a substrate comprising a display region in which a plurality of pixels are provided, and a non-display region at one side of the display region;

at least one transistor on the substrate;

a light emitting element comprising a first electrode connected to the transistor, an emitting layer on the first electrode to emit light, and a second electrode on the emitting layer;

a thin film encapsulation layer on the light emitting element;

a plurality of light blocking patterns on the thin film encapsulation layer, and corresponding to at least a portion of a non-emission region of each pixel;

a planarization layer covering the plurality of light blocking patterns; and a touch sensor comprising:

a plurality of touch electrodes on the planarization layer, configured to sense a touch of a user, and comprising:

a touch electrode row comprising a plurality of first touch electrodes extending along a first direction; and a touch electrode column comprising a plurality of second touch electrodes extending along a second direction crossing the first direction;

a first connection pattern connecting one first touch electrode to an adjacent first touch electrode; and a second connection pattern connecting one second touch electrode to an adjacent second touch electrode, wherein, when viewed on a plane, each light blocking pattern does not overlap any of the first touch electrodes, the second touch electrodes, the first connection pattern, and the second connection pattern.

12. A display device comprising:

a substrate comprising a display region in which a plurality of pixels are provided, and a non-display region at one side of the display region;

at least one transistor on the substrate;

a light emitting element comprising a first electrode connected to the transistor, an emitting layer on the first electrode to emit light, and a second electrode on the emitting layer;

a thin film encapsulation layer on the light emitting element;

a plurality of light blocking patterns on the thin film encapsulation layer, and corresponding to at least a portion of a non-emission region of each pixel;

a planarization layer covering the plurality of light blocking patterns; and a touch sensor comprising:

a plurality of touch electrodes on the planarization layer, configured to sense a touch of a user, and comprising:

a touch electrode row comprising a plurality of first touch electrodes extending along a first direction; and a touch electrode column comprising a plurality of second touch electrodes extending along a second direction crossing the first direction;

a first connection pattern connecting one first touch electrode to an adjacent first touch electrode; and a second connection pattern connecting one second touch electrode to an adjacent second touch electrode, wherein none of the plurality of light blocking patterns overlaps the plurality of touch electrodes, and wherein, when viewed on a plane, each light blocking pattern partially overlaps the first connection pattern and the second connection pattern.

* * * * *